United States Patent
Kaikkonen et al.

(10) Patent No.: US 10,790,568 B2
(45) Date of Patent: Sep. 29, 2020

(54) CARRIER LAYOUT FOR AN ELECTRO-OPTICAL MODULE, AN ELECTRO OPTICAL MODULE USING THE SAME, AND INTERCONNECT STRUCTURE FOR COUPLING AN ELECTRONIC UNIT TO AN OPTICAL DEVICE

(71) Applicant: FINISAR CORPORATION, Sunnyvale, CA (US)

(72) Inventors: Andrei Kaikkonen, Jaerfaella (SE); Robert Monroe Smith, Phoenix, AZ (US); Lennart Per Olof Lundqvist, Jaerfaella (SE); Lars-Goete Svenson, Sollentuna (SE); Marek Grzegorz Chacinski, Farsta (SE)

(73) Assignee: II-VI Delaware Inc., Wilmington, DE (US)

( * ) Notice: Subject to any disclaimer, the term of this patent is extended or adjusted under 35 U.S.C. 154(b) by 0 days.

(21) Appl. No.: 16/085,533

(22) PCT Filed: Mar. 15, 2017

(86) PCT No.: PCT/US2017/022516
§ 371 (c)(1),
(2) Date: Sep. 14, 2018

(87) PCT Pub. No.: WO2017/160989
PCT Pub. Date: Sep. 21, 2017

(65) Prior Publication Data
US 2019/0140335 A1 May 9, 2019

(30) Foreign Application Priority Data
Mar. 15, 2016 (EP) ..................................... 16160425

(51) Int. Cl.
*H05K 7/00* (2006.01)
*H01P 3/08* (2006.01)
(Continued)

(52) U.S. Cl.
CPC .............. *H01P 3/081* (2013.01); *H01P 3/006* (2013.01); *H01P 3/026* (2013.01); *H05K 1/0243* (2013.01);
(Continued)

(58) Field of Classification Search
CPC ........ H01L 31/105; H01P 3/006; H01P 3/026; H01P 3/081; H01P 7/08; H05K 1/0225;
(Continued)

(56) References Cited

U.S. PATENT DOCUMENTS 6,577,211 B1 6/2003 Tsujiguchi
6,674,347 B1 1/2004 Maruhashi et al.
(Continued)

FOREIGN PATENT DOCUMENTS

CA 2 427 158 A1 8/2004
CN 105308488 A 2/2016
(Continued)

OTHER PUBLICATIONS

International Search Report dated Jun. 1, 2017, in related PCT Application No. PCT/US2017/022516.
(Continued)

*Primary Examiner* — Yuriy Semenenko
(74) *Attorney, Agent, or Firm* — Maschoff Brennan

(57) ABSTRACT

A carrier layout comprising a substrate comprising a ground plane layer and a coplanar waveguide interconnect disposed onto the substrate. The coplanar waveguide interconnect comprises a pair of coplanar conductors and a central conductor disposed between the pair of coplanar conductors. The coplanar conductors of the pair are electrically connected to each other by at least one conducting island that is isolated from the ground plane layer. The present invention also provides an interconnect structure for coupling an electronic unit to an optical device disposed on a substrate
(Continued)

having a ground plane layer, the interconnect structure comprising a pair of coplanar conductors and a central conductor disposed between the pair of coplanar conductors. The conductors of the pair are electrically connected by at least one conducting island that is isolated from the ground plane layer.

15 Claims, 7 Drawing Sheets

(51) Int. Cl.
| | |
|---|---|
| H01P 3/00 | (2006.01) |
| H01P 3/02 | (2006.01) |
| H05K 1/02 | (2006.01) |
| H05K 1/11 | (2006.01) |
| H05K 1/18 | (2006.01) |
| H01P 7/08 | (2006.01) |
| H01L 31/105 | (2006.01) |

(52) U.S. Cl.
CPC ............ *H05K 1/115* (2013.01); *H05K 1/181* (2013.01); *H01L 31/105* (2013.01); *H01P 7/08* (2013.01); *H05K 1/0225* (2013.01); *H05K 2201/09063* (2013.01); *H05K 2201/10121* (2013.01); *H05K 2201/10151* (2013.01); *H05K 2201/10174* (2013.01)

(58) Field of Classification Search
CPC ...... H05K 1/0243; H05K 1/115; H05K 1/181; H05K 2201/09063; H05K 2201/10121; H05K 2201/10151; H05K 2201/10174
See application file for complete search history.

(56) References Cited

U.S. PATENT DOCUMENTS

| | | | | |
|---|---|---|---|---|
| 6,879,014 | B2* | 4/2005 | Wagner | ............... H01L 31/1872 257/458 |
| 7,329,054 | B1* | 2/2008 | Epitaux | ................ G02B 6/4249 385/89 |
| 8,891,975 | B2* | 11/2014 | Yagisawa | ........... H04B 10/6911 398/200 |
| 2003/0052380 | A1* | 3/2003 | Yeo | ..................... H01S 5/02276 257/432 |
| 2003/0057355 | A1* | 3/2003 | Wang | ........................ G01J 1/32 250/205 |
| 2007/0241844 | A1 | 10/2007 | Kim et al. | |
| 2008/0123302 | A1* | 5/2008 | Kawano | ................... H04B 3/54 361/728 |
| 2013/0248816 | A1* | 9/2013 | Chu | ........................ H01L 33/22 257/13 |
| 2014/0049343 | A1* | 2/2014 | Sakai | ................... H05K 1/0225 333/219 |
| 2016/0070061 | A1* | 3/2016 | Fasano | .................. G02B 6/122 385/14 |
| 2016/0154177 | A1* | 6/2016 | Han | ..................... G02B 6/4251 385/14 |

FOREIGN PATENT DOCUMENTS

| | | |
|---|---|---|
| CN | 109155451 A | 1/2019 |
| EP | 2744054 A1 | 6/2014 |
| EP | 2775806 A1 | 9/2014 |
| JP | 2001028506 A | 1/2001 |
| JP | 2014175663 A | 9/2014 |
| JP | 2014220727 A | 11/2014 |
| JP | 2016506131 A | 2/2016 |

OTHER PUBLICATIONS

Jeong, Jang-Hyeon et al: "An equivalent circuit analysis of coplanar waveguide employing periodic ground structure on GaAs MMIC", Microwave Conference Proceedings (APMC), 2010 Asia-Pacific, IEEE, Dec. 7, 2010, pp. 614-617.
Written Opinion dated Jun. 1, 2017, in related PCT Application No. PCT/US2017/022516.

* cited by examiner

CARRIER LAYOUT FOR AN ELECTRO-OPTICAL MODULE, AN ELECTRO OPTICAL MODULE USING THE SAME, AND INTERCONNECT STRUCTURE FOR COUPLING AN ELECTRONIC UNIT TO AN OPTICAL DEVICE

TECHNICAL FIELD OF THE INVENTION

The present invention relates to a carrier layout and interconnects for coupling an electronic unit for outputting and/or receiving electric signals, to an optical unit for converting said electric signals into optical signals and/or vice versa, and more particularly, to a carrier layout and interconnects for PIN-TIA arrays.

BACKGROUND OF THE INVENTION

Optical links have been increasingly used as an alternative to fully electrical-wire based interconnection solutions in order to support the communication requirements of high-speed data transmission applications, for instance at transmission bit rates of 25 Gbps. In this context, a variety of electro-optical modules, also called E/O engines, and respective interconnects for connecting the electronic units to the optical units comprised in the E/O engines have been developed for meeting the specific needs of high speed data transfer applications.

Conventional optical units may comprise a light source for transmitting an optical data signal, a photo detector for receiving an optical signal, or both for providing the combined functions of a transmitter and a receiver of optical signals.

In the context of the present invention, electro-optical modules are to be understood as referring to modules comprising components arranged to convert electrical signals into optical signals and/or optical signals into electrical signals, i.e. light sources and photo detectors such as laser diodes and diodes, respectively. In order to convert an electrical data signal into a signal suitable for driving a light source to emit an optical signal comprising this data signal, a driver circuit is required. Similarly, a receiver circuit is required to convert received optical signals into an electrical signal suitable for further transmission in the system. Such driver and receiver circuits are well known in the art and they are typically provided as integrated circuits either as driver chips (comprising driver circuits), transmitter chips (comprising driver circuits), or transceiver chips (comprising a driver and receiver circuit).

A commonly used type of laser diodes is the so-called vertical cavity surface emitting lasers (VCSEL), which are coupled to respective drivers for emitting an optical data signal in response to an electric signal. Photo detectors used in E/O modules often include p-type/intrinsic/n-type (PIN) diodes, which are then coupled a trans-impedance amplifier (TIA).

In order to support more than one transmission channel, such as 2, 4, or N channels, E/O modules are often provided with an array of light-sources and/or photo-detectors for allowing connection to a plurality of optical fibers and transmission lines. One of such E/O devices includes is illustrated in FIG. 1, which depicts a conceptual high frequency model for a 4-channel QSFP (Quad Small Form-factor Pluggable) E/O engine having Driver-VCSEL and PIN-TIA arrays. The coupling of each PIN diode with the respective input/output terminals of the TIA array as well as the coupling of each VCSEL to respective terminals of the driver array is conventionally implemented in the form of micro-strip lines. Due to the constant requirements of size reduction for the electro-optical module, driver and TIA arrays need to be placed close to each other leading to increased Transmitter (Tx)-Receiver (Rx) cross talk. In addition, in order to reduce lead capacitance and sensitivity to interference, the TIA is often placed adjacent to the PIN diode so as to improve performance, thereby providing higher-speed in data transmission and lower noise. Such a compact design of the PIN-TIA module leads to an increase of Rx-Rx cross-talk.

Generally, cross-talk occurs when the signal transported in a signal line creates an unwanted distortion on another signal line due to electromagnetic coupling between signal lines, thereby affecting signal integrity. Cross-talk effects are particularly important in situations where signal lines are placed close to each other and/or transport high-frequency signals.

Therefore, signal integrity is a major concern in data communication systems operating at high data rates, such as for e. g. at 25 Gbps, due to cross-talk effects associated with a dense distribution of signal lines imposed by the requirement of a compact design for E/O modules.

FIG. 1 shows an E/O module 100 according to the state of the art. In the illustrated example, the E/O module 100 is a QSFP E/O module that supports 4 channels and includes a carrier substrate 110 having a ground plane layer 112 arranged on a dielectric non-conductive layer 114, a driver array 120 coupled to a VCSEL array 130 for driving the respective VCSELs to output optical signals in response to incoming electrical signals, such as electrical signals received from a mother board (not shown in FIG. 1), and a PIN array 140 for converting incoming optical signals received, for e.g. from optical fibers (not shown in FIG. 1), into electrical signals that are then fed into respective trans-impedance amplifiers TIA of a respective TIA array 150. In order to support the 4 channels, the VCSEL array 130 includes four VCSELS (not shown in FIG. 1), each VCSEL being coupled by a signal line 132 and a ground line 134 to respective terminals 122 and 124 of a respective driver in the driver array 130. The signal line 132 and the ground line 134 are implemented as interconnects of microstrip type. The PIN array 140 includes four PIN diodes 140a-140d that are coupled to respective trans-impedance amplifiers TIA in the TIA array 150. The anode and cathode terminals of each PIN diode 140a-140d is coupled to the input terminal 152 and output terminal 154 of a respective TIA in the TIA array 150 by microstrip interconnects 142 and 144, which provide the PIN-TIA channels.

In the illustrated arrangement, the VCSEL array 120, the driver array 130, and the TIA array 150 are surrounded by the ground plane layer 112, whereas the PIN array 140 is arranged in an opening 160 of the ground plane layer 112 so as to isolate the PIN diodes 140a-140d from the common ground of the carrier substrate 110. However, since the signal lines 132 coupled to the VCSELs of the VCSEL array 130 and the signal lines 142 connected to PIN diodes 140a-140d of the PIN array 140 are of single-end type, a transfer of signal power from one or a plurality of signal lines (aggressor lines) to another signal line (victim line) may occur via the common ground plane 112, thereby degrading the signal quality at the victim line. In particular, the PIN-TIA channels placed closer to the driver array 120 are affected by crosstalk coming from the driver-VCSEL channels. One or more conducting strip lines 162 and 164 connected to the ground plane layer 112 may be provided across the opening 160 so as the reduce crosstalk in the PIN-TIA channels 142 and 144 more effectively, as described in more detail in the European patent application publication No. EP 2 775 806. For a compact arrangement of the E/O module 100 illustrated in FIG. 1, which has a transmitter (Tx) part provided by the driver-VCSEL array arrangement and a receiver part (Rx) provided by the PIN-TIA array arrangement, the use of PIN-TIA microstrip interconnects may lead to Jitter of about 0.1-0.15 UI being generated at a 25 Gbps bit rate and bit error rate (BER) of $10^{-12}$ due to Tx-Rx and Rx-Rx crosstalk effects, when average optical power for aggressor/victim ratio reaches 8 dB.

Cross-talk between interconnects of the VCSEL-Driver arrays have been previously discussed and addressed in the European patent application publication No. EP 2 744 054. However, there is still a need for a solution that specifically addresses cross-talk effects associated to the use of conventional interconnects of microstrip type in PIN-TIA arrays.

SUMMARY OF THE INVENTION

The present invention has been made in view of the shortcomings and disadvantages of the prior art, and an object thereof is to provide and a carrier layout for an optoelectronic module, in particular, for a PIN-TIA array, a corresponding optoelectronic module and interconnect structure, that allow to reduce or at least minimize effects caused by cross-talk in the signal integrity while meeting the requirements of a compact design.

This object is solved by the subject matter of the appended independent claims. Advantageous embodiments of the present invention are the subject matter of the appended dependent claims.

According to the present invention, it is provided a carrier layout for an electro-optical module, the carrier layout comprising: a substrate comprising a ground plane layer; and a coplanar waveguide transmission line disposed onto the substrate, the coplanar waveguide transmission line comprising: a pair of coplanar conductors; and a central conductor disposed between the pair of coplanar conductors; wherein the coplanar conductors of the pair are electrically connected to each other by at least one conducting island that is isolated from the ground plane layer.

In a further development, the central conductor is adapted to provide a transmission path for transmitting an electric signal from an optical unit to an electronic unit arranged on the substrate and/or vice-versa, and the pair of coplanar conductors is adapted to provide a current return path between the optical unit and the electronic unit.

In a further development, the at least one conducting island is disposed in a respective cavity of the ground plane layer.

In a further development, the cavity has an overture dimensioned so that the self-resonance frequency of the cavity is above a threshold frequency that is related to a fundamental frequency of a signal transmitted by the coplanar waveguide interconnect.

In a further development, said threshold frequency is 40 GHz.

According to a further development, the substrate includes a plurality of cavities along a linear direction of the coplanar waveguide transmission line for arranging a plurality of conducting islands, the plurality of cavities being separated by ground bridges.

According to a further development, the at least one conducting island is formed from the ground plane layer by defining a slot in the ground plane layer along the perimeter of the respective conducting island.

According to a further development, the coplanar waveguide transmission line further comprises a dielectric layer onto which the central conductor and the pair of coplanar conductors are arranged, and the dielectric layer includes a plurality of vias for electrically coupling the coplanar conductors to the at least one conducting island.

According to a further development, the central conductor and the pair of coplanar conductors are provided as conducting strips separated by a constant gap.

According to a further development, the width of the central conductor and the distance between the central conductor and the ground plane layer is selected such as to obtain an impedance that substantially matches an impedance of the electronic unit to be coupled to the coplanar waveguide transmission line.

According to a further development, the carrier layout further comprises a optical device and an electronic unit arranged onto the substrate; wherein the coplanar waveguide transmission line is adapted to couple the optical device to the electronic unit.

According to a further development, the optical device is a PIN diode, and the central conductor and one of the pair of coplanar conductors are coupled to respective terminals of the PIN diode for biasing the PIN diode, wherein the pair of coplanar conductors are not connected to a ground potential.

According to a further development, the electronic unit is a trans-impedance amplifier.

The present invention also provides an electro-optical module comprising the above carrier layout.

The present invention also provides an interconnect structure for coupling an electronic unit to an optical device disposed on a substrate having a ground plane layer, the interconnect structure comprising: a pair of coplanar conductors; and a central conductor disposed between the pair of coplanar conductors; wherein the conductors in the pair of coplanar conductors are electrically connected to each other by at least one conducting island that is isolated from the ground plane layer.

The accompanying drawings are incorporated into the specification and form a part of the specification to illustrate several embodiments of the present invention. These drawings, together with the description serve to explain the principles of the invention. The drawings are merely for the purpose of illustrating the preferred and alternative examples of how the invention can be made and used, and are not to be construed as limiting the invention to only the illustrated and described embodiments. Furthermore, several aspects of the embodiments may form, individually or in different combinations, solutions according to the present invention. The following described embodiments thus can be considered either alone or in an arbitrary combination thereof.

BRIEF DESCRIPTION OF THE FIGURES

Further features and advantages will become apparent from the following more particular description of the various embodiments of the invention, as illustrated in the accompanying drawings, in which like references refer to like elements, and wherein.

DETAILED DESCRIPTION OF THE INVENTION

The present invention will now be more fully described with reference to the figures, in which exemplary embodiments of the invention are shown. The present invention may, however, be embodied in many different forms and should not be construed as limited to the embodiments set forth herein. Rather, these embodiments are provided so that the disclosure will be thorough and complete, and will fully convey the scope of the invention to those skilled in the art.

Figure 2:
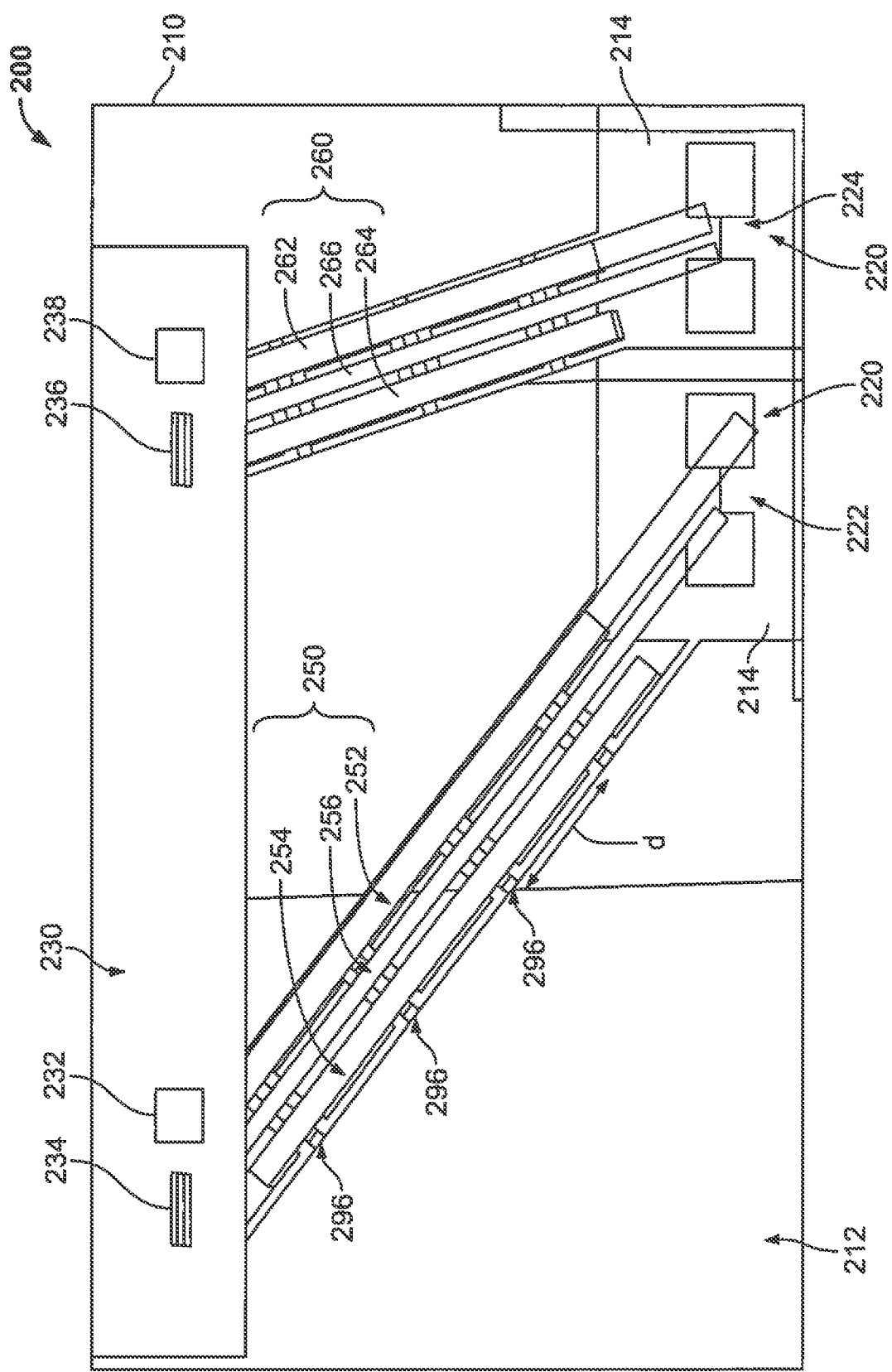
FIG. 2 is a represents schematically a top view of a section of a carrier layout having an array of optical devices and an array of electronic unit arranged thereon, each optical device being electrically coupled to a respective electronic unit via a coplanar waveguide interconnect with a ground net structure according to the present invention.

FIG. 2 represents schematically a top view of a section of a carrier layout 200 for an electro-optical module. The carrier layout 200 includes a substrate 210 on which an array of optical devices, such as a PIN diode array 220, and an array of electronic units, such as a TIA array 230, are arranged. For illustration purposes, only two PIN diodes 222 and 224 of the PIN array 220 are represented in FIG. 2. However, the PIN array 220 may include only one PIN diode or more than two PIN diodes for supporting one or more than two transmission channels, each PIN diode being coupled to a respective TIA unit of the TIA array 220.

The substrate 210 includes a ground plane layer 212 that is deposited over a dielectric non-conductive layer 214. Similarly to FIG. 1, the TIA array 230 is surrounded by the ground plane layer 212 whereas the PIN diodes 222, 224 are mounted inside openings 240 of the ground plane layer 212 that isolate the PIN diodes 222, 224 from the carrier common ground.

In order to avoid or minimize cross talk effects associated with the use of PIN-TIA interconnects of microstrip type, each PIN diode 222 and 224 is electrically coupled to the respective TIA by respective coplanar waveguide (CPW) interconnects 250 and 260, as it will be described in the following with reference to FIGS. 2 to 4.

The CPW interconnect 250 includes a pair of coplanar conductors 252 and 254, and a center conductor 256 that is disposed between the pair of coplanar conductors 252, 254 and separated from them by a narrow gap. Both the center conductor 256 and the pair of coplanar conductors 252, 254 may be deposited over a common dielectric layer 258, as shown in FIG. 4. The effective dielectric constant, characteristic impedance and attenuation of the CPW are essentially determined by the dimensions of the center strip, namely, by its width, the separation gap to the adjacent ground planes, as well as the thickness and permittivity of the underlying dielectric layer of the CPW interconnect 250. The dimensions of the adjacent ground conductors 252, 254 of the CPW interconnect 250 do not significantly influence the characteristics of the CPW as long as their width is larger than the width of the center strip 256 and sufficiently for the pair of coplanar conductors 252, 254 behaving like ground planes conductors.

In conventional grounded coplanar waveguide (GCPVV) configurations, the pair of coplanar conductors of the coplanar waveguide is electrically connected to a common ground. In this configuration, the central strip provides the signal line for transmitting an electrical signal, whereas the pair of coplanar conductors provides a ground line.

However, although the pair of coplanar conductors in a conventional grounded configuration provides a low impedance for the current return path, and therefore, introduces a lower level of cross talk in a PIN-TIA array layout than an interconnect of a microstrip type, a CPW connected to ground is not suitable for directly coupling an optical device to a respective electronic unit, such as for coupling the PIN diodes of the PIN array 220 to the TIA array 230, for the reason that a PIN diode must be biased such that the diode cathode is at potential lower than the anode potential but different from zero.

The CPW interconnect 250 and 260 allow biasing the PIN diodes 222 and 224 while provide a low impedance for the current return path in that the pair of coplanar conductors in each CPW interconnect 250 and 260 is electrically coupled by respective ground-net structures 270 and 280 that are electrically isolated from the common ground provided by the ground plane layer 212. For each CPW interconnect 250 and 260, it is then sufficient that only one of the pair of coplanar conductors be directly connected to the cathode of the respective PIN diode 222 and 224. For instance, in the case of the PIN diode 222 shown in FIG. 2, the rightmost conductor strip 252 of the CPW interconnect 250 directly couples the cathode of the PIN diode 222 to an output terminal 232 of the TIA array 230, whereas the leftmost conductor strip 254 is indirectly coupled to the cathode of the PIN diode 222 via the underlying ground-net structure 270. The center conductor 256 of the CPW interconnect 250 is directly coupled to the anode of the PIN diode 222 and provides the signal line between the PIN diode 222 and the input terminal 234 of the respective TIA in the TIA array 230. A similar coupling between the PIN diode 224 and the respective input and output terminals 236, 238 of the TIA array 230 is provided by the CPW interconnect 260.

The ground-net structures 270 and 280 will now be described with reference to FIG. 3, in which the CPW interconnects 250 and 260 shown in FIG. 2 have been removed for showing the respective underlying ground-net structures.

Figure 3:
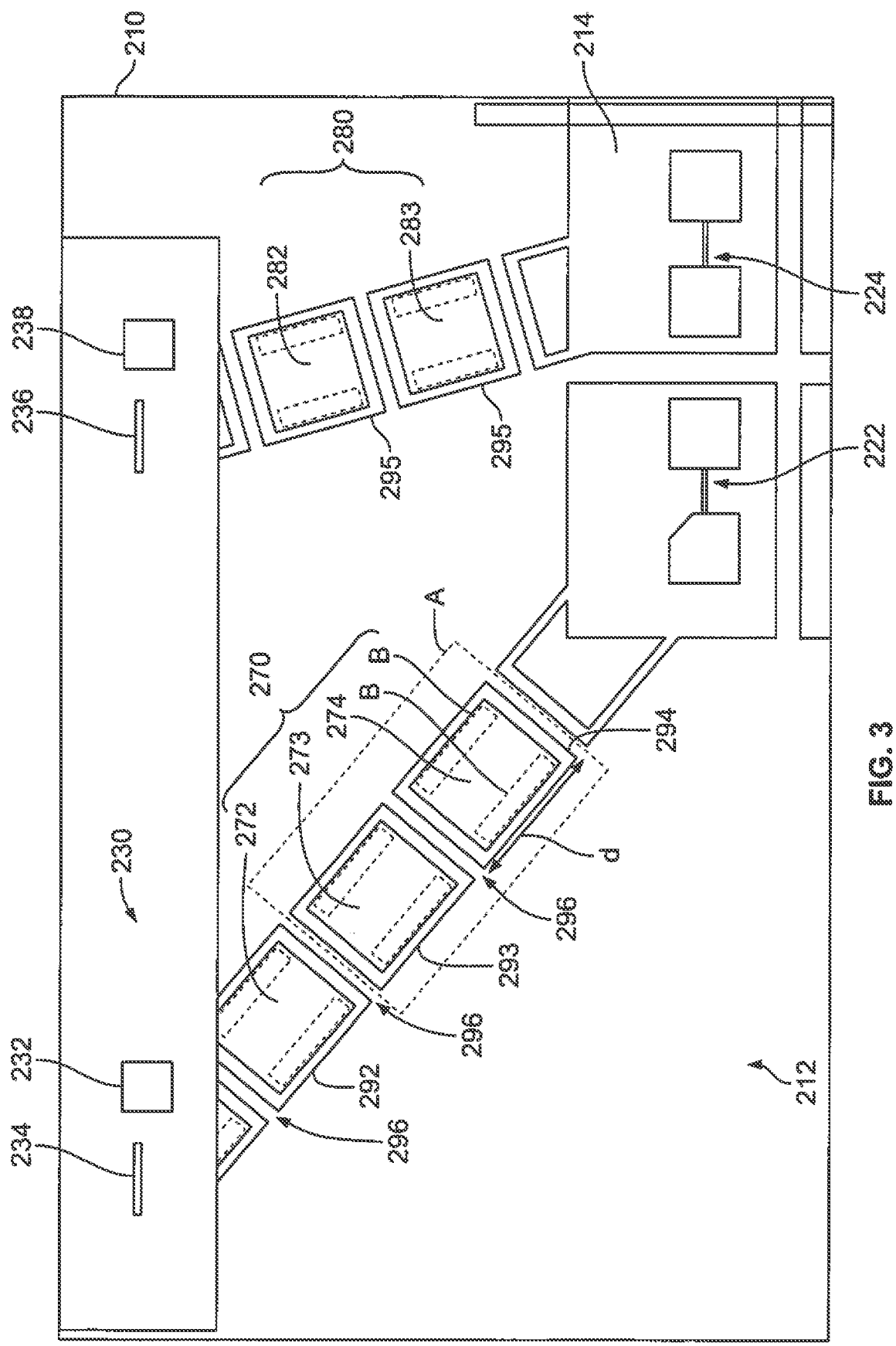
FIG. 3 is a schematic view of the carrier layout section shown in FIG. 2 from which the coplanar waveguide interconnect has been removed for showing the underlying ground-net structure.

As it can be seen from FIG. 3, each of the ground-net structures 270 and 280 include at least one conducting island that is isolated from the ground plane layer 212. As evident from FIG. 3, the number of isolated islands depends on the length of the respective CPW interconnect and is not limited to the illustrated example.

With reference to the ground-net structure 270, the conducting islands 272-274 may be arranged side-by-side along a linear direction of the CPW interconnect 250 such as to provide several connecting points between the pair of coplanar conductors 252, 254 along the length of the CPW interconnect 250. The conducting islands 272-274 are isolated from the ground plane layer 212 in that they are disposed in respective cavities 292-294 of the ground plane layer 212, as shown in FIG. 4. Each of the conducting islands 272-274 may be formed from the ground plane layer 212 by defining slots in the ground plane layer 212 along the whole perimeter of each of the conducting islands 272-274 and across the thickness of the ground plane layer 212 until reaching the underlying dielectric layer 214 of the carrier substrate 210. Alternatively, the ground-net structure 270 may be obtained by first defining the initial structure of cavities 292-294 in the ground plane layer 212, followed by a deposition of the respective conducting islands 272-274 inside the cavities 292-294 such that the conducting islands 292-294 do not contact with the surrounding ground plane layer 212. Each of the coplanar conductors 252, 254 and 262, 264 of the CPW interconnects 270 and 280 are electrically coupled to the conducting islands of the respective ground-net structures 270 and 280 by one or more vertical vias that run across the dielectric layer of the CPW interconnects 270 and 280. For instance, as shown in FIG. 4, the dielectric layer 258 of the CPW interconnect 250 may include one or more vertical vias 259 that are placed at positions that match the position of the underlying conducting islands 273 and 274 along the length of the CPW interconnect 250. The electrical contact area of the coplanar conductors 252, 254 with the conducting islands 272, 274 is delimited by dashed lines B in FIGS. 3 and 4. The configuration of the ground-net structure 280 that underlies the CPW interconnect 260 is similar to the ground-net structure 270 and therefore, it will not be further described here.

In the illustrated example, the upper surfaces of the isolated islands 272-274 and 282-283 that faces the respective CPW interconnects 250 and 260 have a shape that is substantially rectangular. However, other forms and shapes for the isolated islands may be envisaged. In addition, the dimensions of the ground-net structure may vary depending on the specific dimensions of the associated CPW interconnect. Moreover, the isolated islands that form a ground-net structure do not have to be aligned side-by-side such as in the illustrated examples, but may be arranged according to other patterns as long as they provide sufficient connection points between the pair of coplanar conductors of the associated CPW interconnect.

Namely, a ground-net structure configuration may be envisaged in which a single isolated island is provided within a single cavity that runs along at least a part of the length of the CPW interconnect. The size of the cavities forming the ground-net structures 270 and 280 associated with the CPW interconnects 250 and 260 (and consequently, the size of the respective isolated islands) depend on the effects of self-resonance of the cavities at the frequency of the transmitted signals. In particular, each cavity of the ground-net structures 270 and 280 should have an overture dimensioned so that the respective self-resonance frequency is above a given threshold frequency. The threshold frequency is selected based on the specific application and is related to the fundamental frequency of the signal transmitted by the coplanar waveguide interconnects 250 and 260.

For instance, each opening 292-294 of the ground-net structure 270 should have a self-resonance frequency that is 3 times higher than the fundamental frequency of the signals to be transmitted by the CPW interconnect 250. In the case of data communications at 25 Gbps, the fundamental frequency of the signals to be transmitted/received is 12.5 GHz. Therefore, the size of the cavities 292-294 may be selected such that their respective self-resonance frequency is above a threshold frequency of about 38 is GHz, preferably, above 40 GHz. This corresponds to the opening of the cavities 292-294 having a width smaller than about 500 micrometers along the transmission direction of the CPW interconnect. As shown in FIG. 3, the size of the cavities in the transmission direction of the CPW interconnect may be limited by introducing ground bridges 296 at regular intervals.

The size of the cavities 292-294 in the direction transverse to the transmission direction of the CPW interconnects 270 should be large enough so as to allow at least a partial overlap between the pair of coplanar conductors 252, 254 and the underlying isolated islands 272-274 so that the conductors 252, 254 of the pair can be effectively connected to each other.

The dimensions of the conductors forming the CPW interconnect 270, namely the width of the center strip conductor 256 and the thickness of the CPW dielectric layer 258, which will determine the distance between the central strip 256 and the underlying ground plane layer 212, are selected depending on the requirements of particular application. For instance, the center strip 256 should have an impedance that matches the impedance of the TIA to which the PIN diode 222 will be connected. As an example, an impedance of 50 Ohm may be achieved using a central strip of 15 μm width over a dielectric layer with a dielectric constant of 2.6 and 10 μm thickness.

Figure 5:
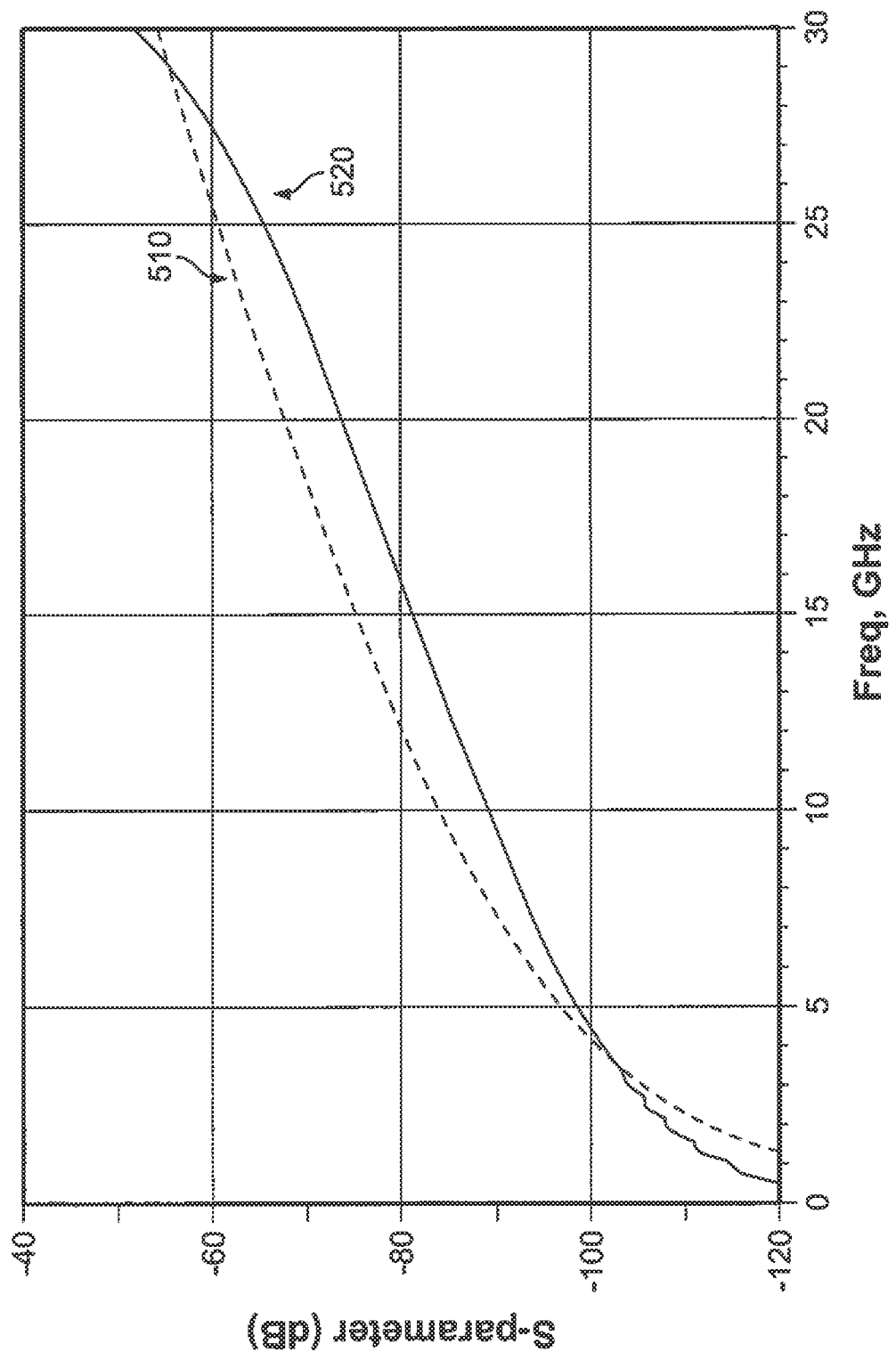
FIG. 5 depicts two curves of the principal s-parameter coupling coefficient vs. frequency corresponding to the strongest single-end-type cross talk from driver output to the closest TIA input obtained for the arrangement of FIG. 1 when using a PIN-TIA microstrip interconnect (dashed line) and a coplanar waveguide interconnect with ground net structure (solid line)
Figure 6:
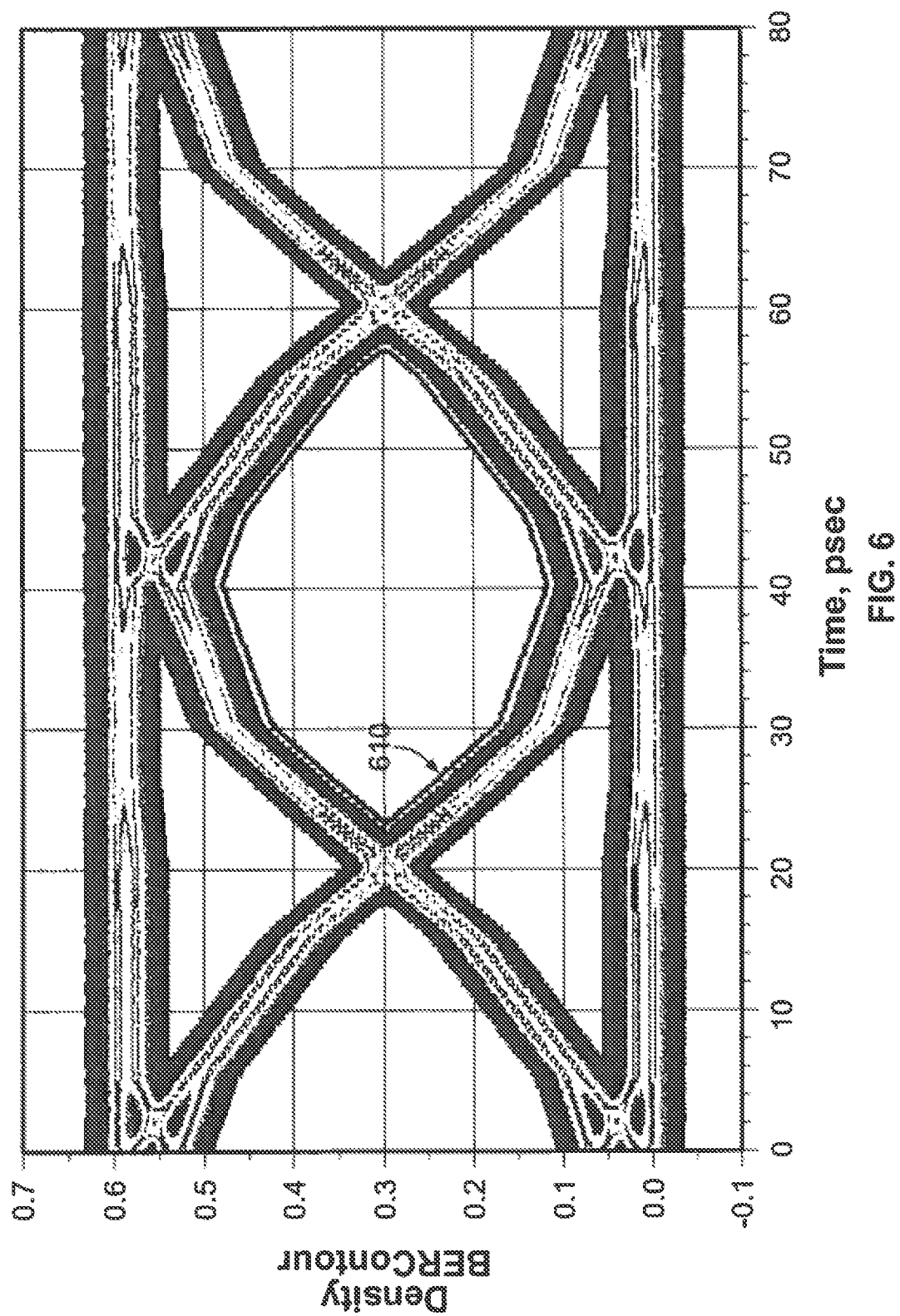
FIG. 6 is a 25 Gbps eye diagram for a PIN-TIA channel of the arrangement driver-VCSEL array (Tx) and PIN-TIA array (Rx) shown in FIG. 1, in which the PIN-TIA interconnects are of a microstrip type and all Tx-Tx and Rx-Rx aggressor channels are activated.
Figure 7:
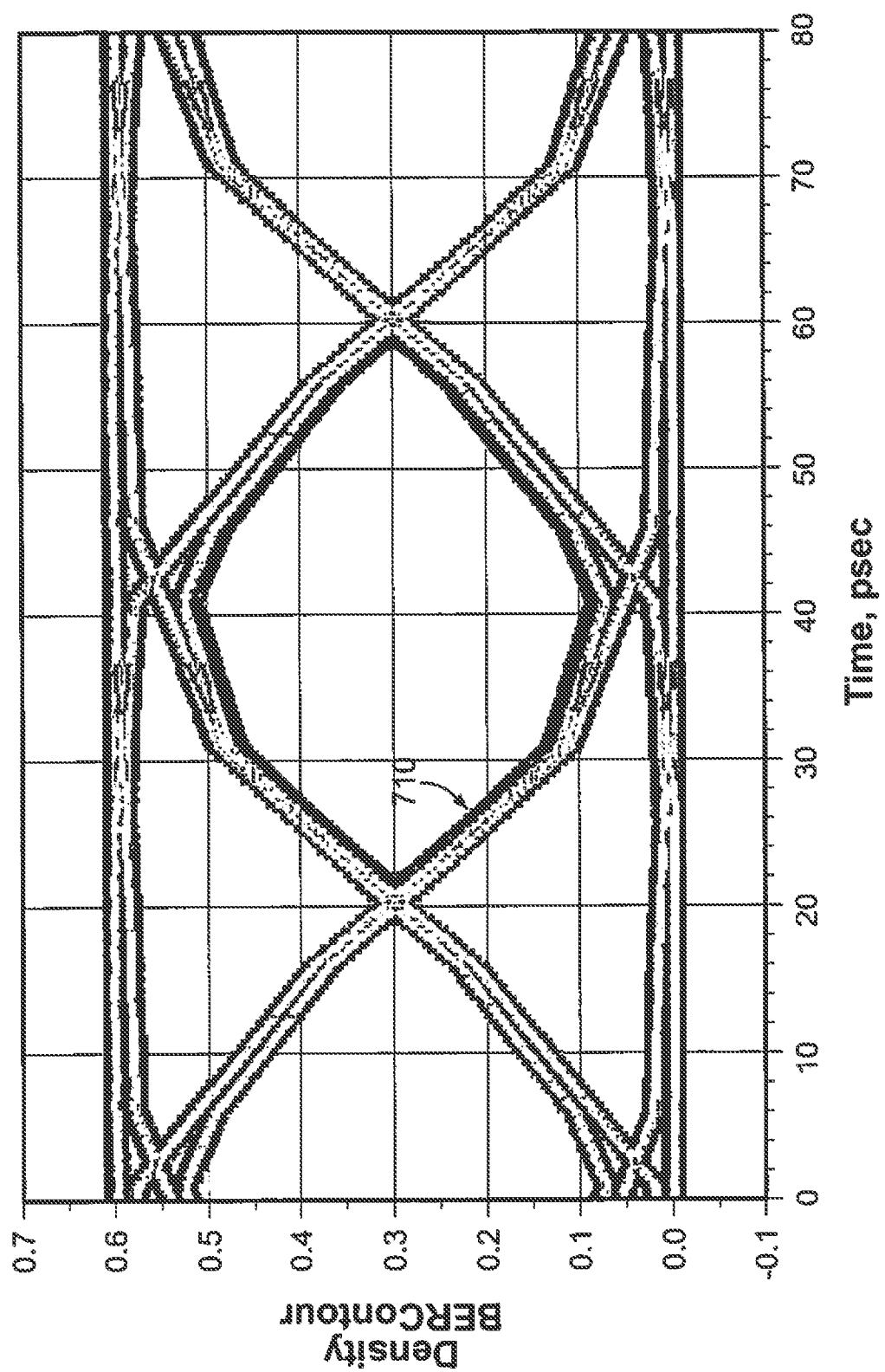
FIG. 7 is a 25 Gbps eye diagram for a PIN-TIA channel of an arrangement driver-VCSEL array (Tx) and PIN-TIA array (Rx) similar to FIG. 1, in which the PIN-TIA interconnects are replaced by the coplanar waveguide with ground net interconnects shown in FIG. 2 and having all Tx-Tx and Rx-Rx aggressor channels activated.

The reduction cross-talk effects due to the use of CPW with ground net structure for the PIN-TIA interconnects in comparison to the use of microstrip type PIN-TIA interconnects is illustrated by the simulations results shown in FIGS. 5 to 7.

Figure 1:
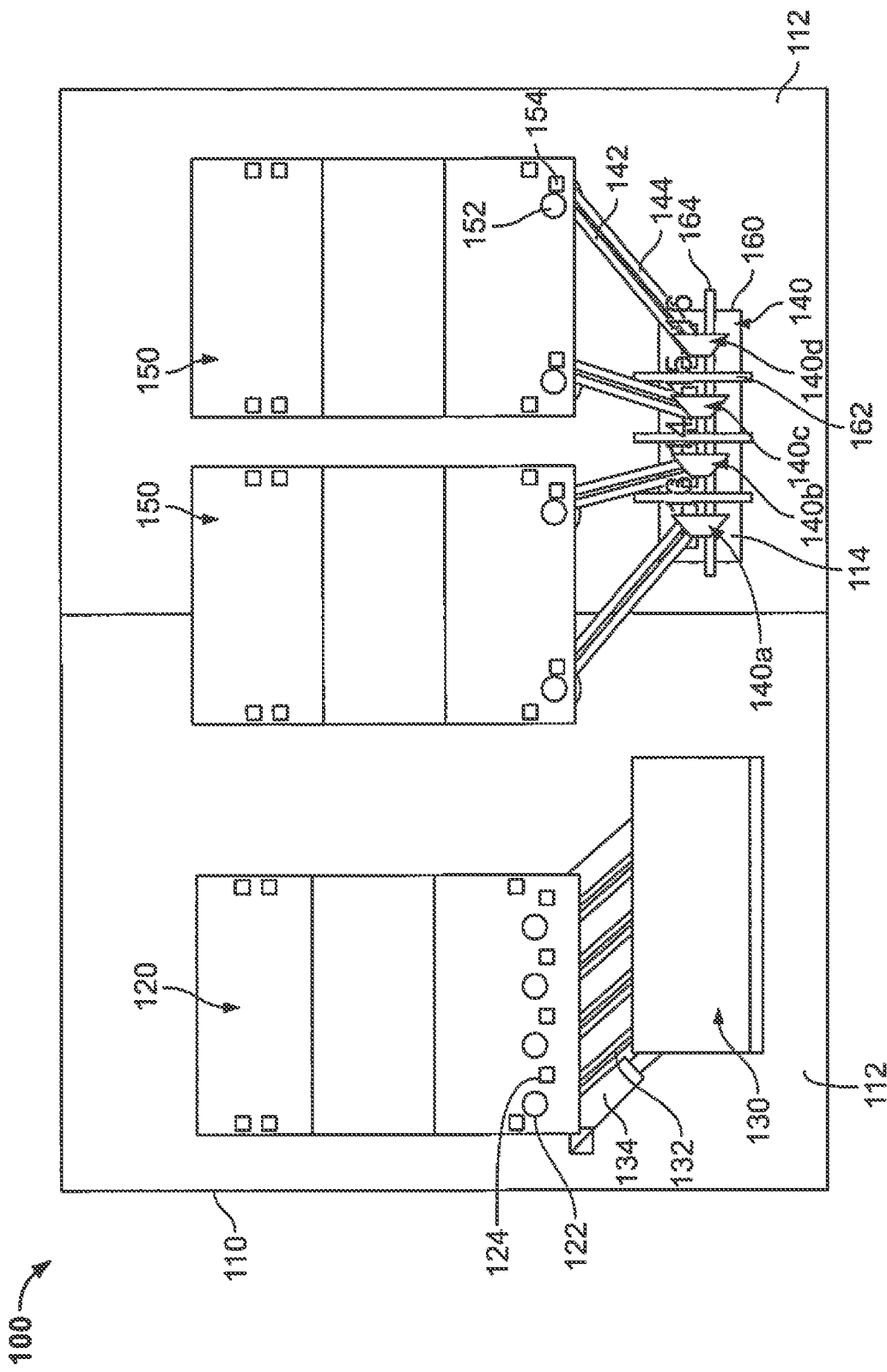
FIG. 1 is a schematic representation of a conceptual high frequency model for a 4-channel QSFP E/O engine according to the state of the art.

FIG. 5 depicts two curves of the principal s-parameter coupling coefficient corresponding to the strongest single-end-type cross talk from the driver output to the closest TIA input in an arrangement according to FIG. 1. The solid line corresponds to the case of CPW with ground net structure are used for the PIN-TIA interconnects, whereas the dashed line corresponds to case where PIN-TIA interconnects of microstrip type are used. A lower value of the principal s-parameter is indicative of a weaker cross-talk coupling at a given frequency. As it can be seen from FIG. 3, for CPW with ground net interconnects the cross-talk coupling is reduced over a significant frequency range from about 4 GHz to 29 GHz as compared to PIN-TIA interconnects of microstrip type, reaching a difference of about 0.64 dB at a frequency of 15 GHz.

FIGS. 6 and 7 show simulation results of eye diagrams obtained for a PIN-TIA channel with all Tx-Rx and Rx-Rx aggressor channels activated in a driver-VCSEL and PIN-TIA arrangement as shown in FIG. 1, when using PIN-TIA interconnects of a microstrip type (FIG. 6) and CPW with ground net interconnects (FIG. 7) at a 25 Gbps bit rate. The simulations correspond to −8 dBm victim average optical input power, and 8 dB aggressor to victim optical input power ratio. The solid outlines 610 and 710 in the eye diagrams correspond to a bit error rate (BER) of $10^{-12}$. As it can be seen from FIG. 6, in the case where microstrip type PIN-TIA interconnects are used, the simulation results shown that when all driver-VCSEL and PIN-TIA aggressor channels activated, the generated Tx-Rx and Rx-Rx crosstalk is about 5 ps or 0.12 UI jitter in the eye diagram at a 25 Gbps bit rate and BER=$10^{-12}$. In contrast thereto, as it can be seen from FIG. 7, less than 2 ps or 0.05 UI Jitter is generated at the same bit rate in the case of using CPW with ground net PIN-TIA interconnects. The jitter generated by Tx-Rx and Rx-Rx cross-talk is, therefore, significantly reduced with CPW with ground net interconnects.

Consequently, the carrier layout for an E/O module, and in particular, the carrier layout for a PIN-TIA array, and the CPW with ground net interconnects described above provide a solution that allows to significantly reduce cross-talk effects in comparison to solution based on microstrip-type interconnects and even in cases where the components of the PIA-TIA array and respective interconnects are distributed close to each other so as to meet the requirements of a compact design.

Although certain features of the above exemplary embodiments were described using terms such as "upper" and "top", these terms are used for the purpose of facilitating the description of the respective components of and how they are oriented with respect to each other only and should not be construed as limiting the claimed invention or any of its components to an installation or use in a particular spatial orientation. Moreover, although the present invention has been described above with specific reference to a PIN-TIA array layout, the principles of the present invention can also be advantageously for connecting other types of optical devices and respective electronic units without departing from the scope of the present invention.

LIST OF REFERENCE NUMERALS

Figure 4:
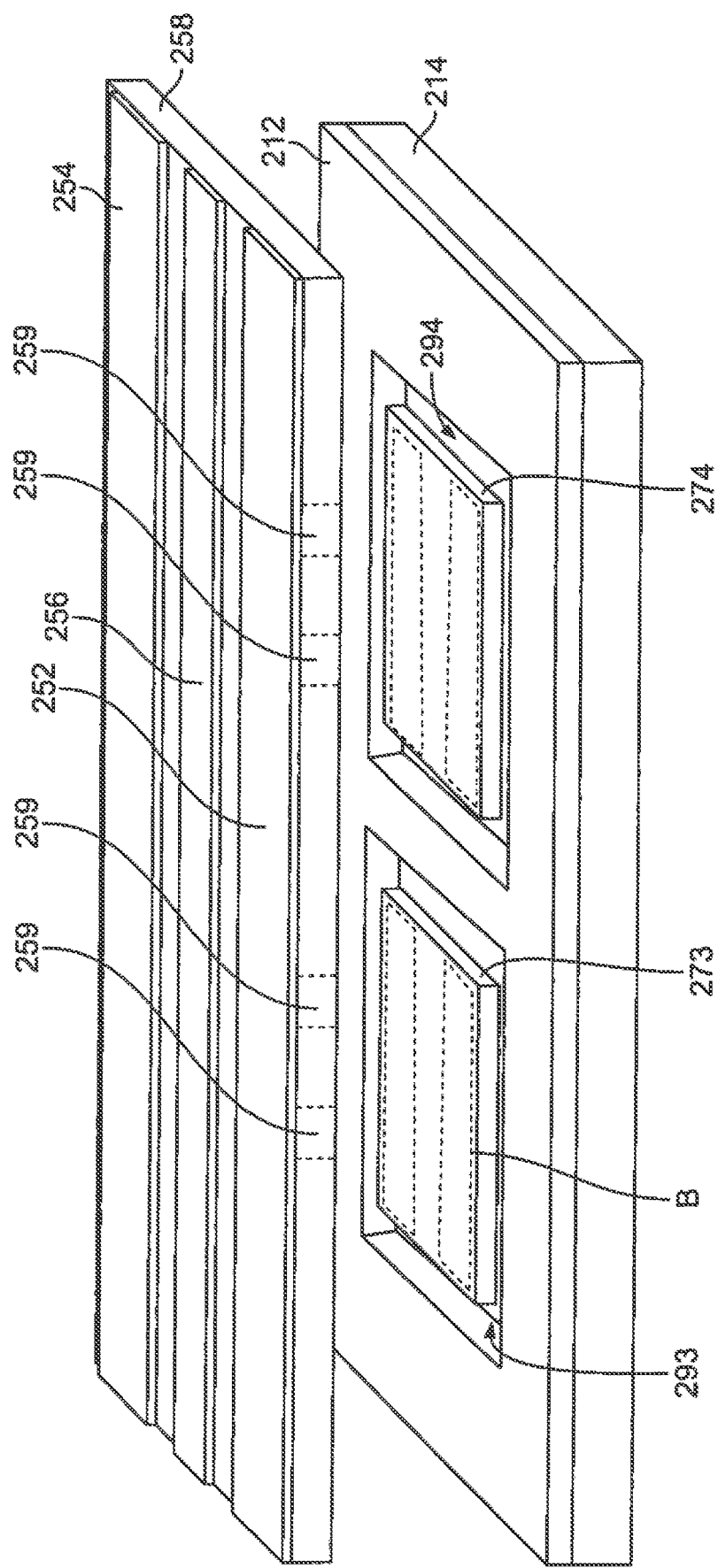
FIG. 4 represents schematically a coplanar waveguide interconnect and two conducting islands of the underlying ground net structure of the section A shown in FIG. 3.

100 E/O module
110 carrier substrate
112 ground plane layer
114 dielectric layer
120 driver array
130 VCSEL array
122, 124 output and input terminals of driver
132, 134 signal line and ground line of VCSEL
140 PIN array
140a-140d PIN diodes
142, 144 signal line and ground line of PIN diode
150 trans-impedance amplifiers TIA
152, 154 terminals of TIA
160 opening in ground plane
162, 164 conducting strip lines
200 carrier layout
210 substrate
212 ground plane layer
214 nonconductive dielectric layer
220 PIN array
222, 224 PIN diode
230 TIA array
232, 234 output and input terminal of TIA
240 openings of ground plane layer
250 first CPW interconnect
252, 254 pair of co-planner conductors of CPW
256 center conductor of CPW
258 dielectric layer of CPW
259 vias
260 second CPW interconnect
262, 264 pair of co-planner conductors of CPW
266 center conductor of CPW
270, 280 grounded structures
272-274, 282-283 conducting islands
292-294 cavity of the ground plane layer for conducting island
296 ground bridges
A section of ground-net structure in FIG. 3
B dashed lines in FIGS. 3 and 4
510 principal s-parameter curve for microstrip interconnects
520 principal s-parameter curve for CPW ground net interconnects
610, 710 outlines in the eye diagram corresponding to a bit error rate of $10^{-12}$

The invention claimed is:

1. A carrier layout for an electro-optical module, the carrier layout comprising:
   a substrate comprising a ground plane layer; and
   a coplanar waveguide interconnect disposed onto the substrate, the coplanar waveguide interconnect comprising:
      a pair of coplanar conductors; and
      a central conductor disposed between the pair of coplanar conductors;
      wherein the coplanar conductors of the pair are electrically connected to each other by at least one conducting island that is isolated from the ground plane layer.

2. A carrier layout according to claim 1, wherein
   the central conductor is adapted to provide a transmission path for transmitting an electric signal from an optical device to an electronic unit arranged on the substrate and/or vice-versa, and
   the pair of coplanar conductors is adapted to provide a current return path between the optical device and the electronic unit.

3. A carrier layout according to claim 1, wherein
   the at least one conducting island is disposed in a respective cavity of the ground plane layer.

4. A carrier layout according to claim 3, wherein
   the cavity has an overture dimensioned so that the self-resonance frequency of the cavity is above a threshold frequency that is related to a fundamental frequency of a signal transmitted by the coplanar waveguide interconnect.

5. A carrier layout according to claim 4, wherein said threshold frequency is 40 GHz.

6. A carrier layout according to claim 1, wherein
   the substrate includes a plurality of cavities along a linear direction of the coplanar waveguide interconnect for arranging a plurality of conducting islands,
   the plurality of cavities being separated by ground bridges.

7. A carrier layout according to claim 1 any one of the preceding claims, wherein
   the at least one conducting island is formed from the ground plane layer by defining a slot in the ground plane layer along the perimeter of the respective conducting island.

8. A carrier layout according to claim 1, wherein
   the coplanar waveguide interconnect further comprises a dielectric layer onto which the central conductor and the pair of coplanar conductors are arranged, and
   the dielectric layer includes a plurality of vias for electrically coupling the coplanar conductors to the at least one conducting island.

9. A carrier layout according to claim 1, wherein the central conductor and the pair of coplanar conductors are provided as conducting strips separated by a constant gap.

10. A carrier layout according to claim 1, wherein the width of the central conductor and the distance between the central conductor and the ground plane layer is selected such as to obtain an impedance that substantially matches an impedance of the electronic unit to be coupled to the coplanar waveguide interconnect.

11. A carrier layout according to claim 1, further comprising a optical device and an electronic unit arranged onto the substrate; wherein the coplanar waveguide interconnect is adapted to couple the optical device to the electronic unit.

12. A carrier layout according to claim 11, wherein
the optical device is a PIN diode, and
the central conductor and one of the pair of coplanar conductors
are coupled to respective terminals of the PIN diode for biasing the PIN diode, wherein the pair of coplanar conductors are not connected to a ground potential.

13. A carrier layout according to claim 11, wherein the electronic unit is a trans-impedance amplifier.

14. An electro-optical module comprising the carrier layout according to claim 1.

15. An interconnect structure for coupling an electronic unit to an optical device disposed on a substrate having a ground plane layer, the interconnect structure comprising:
a pair of coplanar conductors; and
a central conductor disposed between the pair of coplanar conductors;
wherein the conductors in the pair of coplanar conductors are electrically connected to each other by at least one conducting island that is isolated from the ground plane layer.

* * * * *